(12) United States Patent (10) Patent No.: US 8,547,513 B2
Kim et al. (45) Date of Patent: Oct. 1, 2013

(54) LIQUID CRYSTAL DISPLAY DEVICE AND METHOD OF MANUFACTURING THE SAME

(75) Inventors: Dae Hyun Kim, Seoul (KR); Hyo Sik Song, Seoul (KR); Sun Wook Hwang, Gyeongsan-si (KR)

(73) Assignee: LG Display Co., Ltd., Seoul (KR)

( * ) Notice: Subject to any disclaimer, the term of this patent is extended or adjusted under 35 U.S.C. 154(b) by 257 days.

(21) Appl. No.: 13/207,153

(22) Filed: Aug. 10, 2011

(65) Prior Publication Data

US 2012/0038874 A1 Feb. 16, 2012

(30) Foreign Application Priority Data

Aug. 10, 2010 (KR) .......................... 10-2010-0077055
Jul. 15, 2011 (KR) .......................... 10-2011-0070669

(51) Int. Cl.
*G02F 1/1368* (2006.01)
*G02F 1/139* (2006.01)

(52) U.S. Cl.
USPC ............. 349/141; 349/43; 349/122; 349/138; 349/187

(58) Field of Classification Search
USPC ....... 349/42, 43, 122, 138, 141, 187; 257/59, 257/72, E33.012; 345/92; 438/30; 430/321
See application file for complete search history.

(56) References Cited

U.S. PATENT DOCUMENTS

| | | | |
|---|---|---|---|
| 2002/0001048 A1* | 1/2002 | Lee et al. ........................ | 349/43 |
| 2004/0257510 A1* | 12/2004 | Chae ............................. | 349/141 |
| 2007/0146591 A1* | 6/2007 | Kimura et al. ................ | 349/114 |
| 2008/0088788 A1* | 4/2008 | Cho et al. ..................... | 349/160 |

* cited by examiner

*Primary Examiner* — Dung Nguyen
*Assistant Examiner* — Tai Duong
(74) *Attorney, Agent, or Firm* — Brinks Hofer Gilson & Lione

(57) ABSTRACT

A liquid crystal display device adapted to reduce power consumption and to prevent deterioration of the picture quality is disclosed. The liquid crystal display device includes: a substrate; pixel regions defined by a plurality of gate lines and a plurality of data lines arranged on the substrate which are arranged to intersect with each other on the substrate; thin film transistors each formed at intersections of the pluralities of gate and data lines; pixel electrodes formed in each of the pixel regions; a passivation layer formed on an entire surface of the substrate provided with the thin film transistors, the gate lines, the data lines and the pixel electrodes; and common electrode wirings and common electrode patterns formed on the passivation layer, wherein the passivation layer includes a first portions formed on an gate insulation layer opposite to the thin film transistors, gate lines and data lines, and second portions formed on the pixel regions corresponding to the pixel electrodes in a thinner thickness than that of the first portion.

20 Claims, 16 Drawing Sheets

LIQUID CRYSTAL DISPLAY DEVICE AND METHOD OF MANUFACTURING THE SAME

This application claims the benefit of Korea Patent Application No. 10-2010-0077055, filed on Aug. 10, 2010 and Korea Patent Application No. 10-2011-0070699, filed on Jul. 15, 2011, the entire contents of which is incorporated herein by reference for all purposes as if fully set forth herein.

BACKGROUND

1. Field of the Invention

This disclosure relates to a liquid crystal display (LCD) device, and more particularly to an LCD device adapted to reduce power consumption and to prevent deterioration of the picture quality and to a method of manufacturing the same.

2. Discussion of the Related Art

The current trend is that liquid crystal display (LCD) devices are widening their application in various fields because of their features, such as their light weight, slimness, low driving voltage, and so on. This trend is evidently confirmed in the ways in which the LCD devices have been applied to office automation equipment, audio equipment, video equipment, and so on.

LCD devices adopt a light transmittance characteristic of liquid crystal varying along an applied voltage and convert electric signals into visual information, thereby displaying an image. The liquid crystal should be of a material which is in a medium state between the liquid and the crystal. To this end, the LCD devices each include two substrates having electrodes and a liquid crystal layer interposed between the substrates. Such LCD devices are lighter and thinner and are driven at a lower voltage in comparison with other display devices that have the same screen size.

The LCD device allows each pixel of an LCD panel in its front side to selectively transmit light emitted from a light source in its rear side, thereby displaying an image. In this case, each pixel on the LCD panel functions as a light switch. Such an LCD device controls the intensity of light generated in the light source so as to display an image, unlike a CRT (Cathode Ray Tube) of the related art which adjusts the intensity of an electric beam and controls brightness.

The LCD panel included in the above mentioned LCD device is manufactured in a structure in which a color filter substrate (i.e., an upper substrate) and a thin film transistor substrate (i.e., a lower substrate) are combined with a liquid crystal layer between the two substrates. The color filter substrate is provided with color filters formed thereon. The thin film transistor substrate is provided with thin film transistors formed thereon.

The thin film transistor substrate of the ordinary LCD panel includes gate lines and data lines crossing each other and thin film transistors TFTs formed at intersections of the gate and data lines.

Each of the thin film transistors includes a gate electrode and source/drain electrodes formed with a gate insulation layer between the electrodes. The drain electrode is electrically connected to a pixel electrode.

A passivation (or protective) layer is formed on the gate insulation layer provided with the source/drain electrode and the pixel electrode. A common electrode wiring and a common electrode pattern are formed on the passivation layer.

In this manner, the thin film transistor substrate included in the ordinary LCD device of a transverse electric field mode forces not only the common wiring to be formed on the gate and data lines but also the common pattern to be formed on the pixel electrode. As such, a parasitic capacitance is caused between the gate and data lines and the common electrode wiring, and furthermore a vertical crosstalk occurs. Therefore, picture quality of the ordinary LCD device deteriorates.

In order to reduce the parasitic capacitance, the ordinary LCD device can be designed to increase the thickness of the passivation layer. In this case, the distance between the pixel electrode and the common electrode patterns must be enlarged. As such, the transmittance characteristic of the ordinary LCD device is lowered due to the decrease of the electric power affecting the electric field which is applied to the liquid crystal. Also, it causes difficulties in the manufacturing process of the LCD device. Furthermore, the WVGA (Wide Video Graphics Array) LCD device of a high definition model having 800×400 dots forces a storage capacitance between the pixel electrode and the common electrode pattern to decrease due to its small-sized pixel.

BRIEF SUMMARY

An LCD device includes: a substrate; pixel regions defined by a plurality of gate lines and a plurality of data lines arranged on the substrate which are arranged to intersect with each other on the substrate; thin film transistors each formed at intersections of the pluralities of gate and data lines; pixel electrodes formed in each of the pixel regions; a passivation layer formed on an entire surface of the substrate provided with the thin film transistors, the gate lines, the data lines and the pixel electrodes; and common electrode wirings and common electrode patterns formed on the passivation layer. The passivation layer includes a first portions formed on an gate insulation layer opposite to the thin film transistors, gate lines and data lines, and second portions formed on the pixel regions corresponding to the pixel electrodes in a thinner thickness than that of the first portion.

A method of manufacturing an LCD device according to another aspect of the present embodiment includes: forming gate electrodes, gate lines and gate pads on a base substrate; forming a gate insulation layer on the base substrate with the gate electrodes, the gate lines and the gate pads; forming semiconductor patterns on the gate insulation layer; forming a pixel electrodes on the gate insulation layer corresponding to pixel regions; forming source/drain electrodes and data lines on the gate insulation layer provided with the semiconductor patterns; and forming a passivation layer on the gate insulation layer provided with the semiconductor patterns, the source/drain electrodes, the pixel electrodes, gate lines and the data lines. The passivation layer is defined into: a first portion opposite to the semiconductor patterns, the source/drain electrodes, the gate lines and the data lines; and second portions, respectively opposite to the pixel electrodes, which are formed in a thinner thickness than that of the first portion through a photolithography process using any one of a half tone mask and a diffraction mask.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION OF THE DRAWINGS AND THE PRESENTLY PREFERRED EMBODIMENTS

Figure 1:
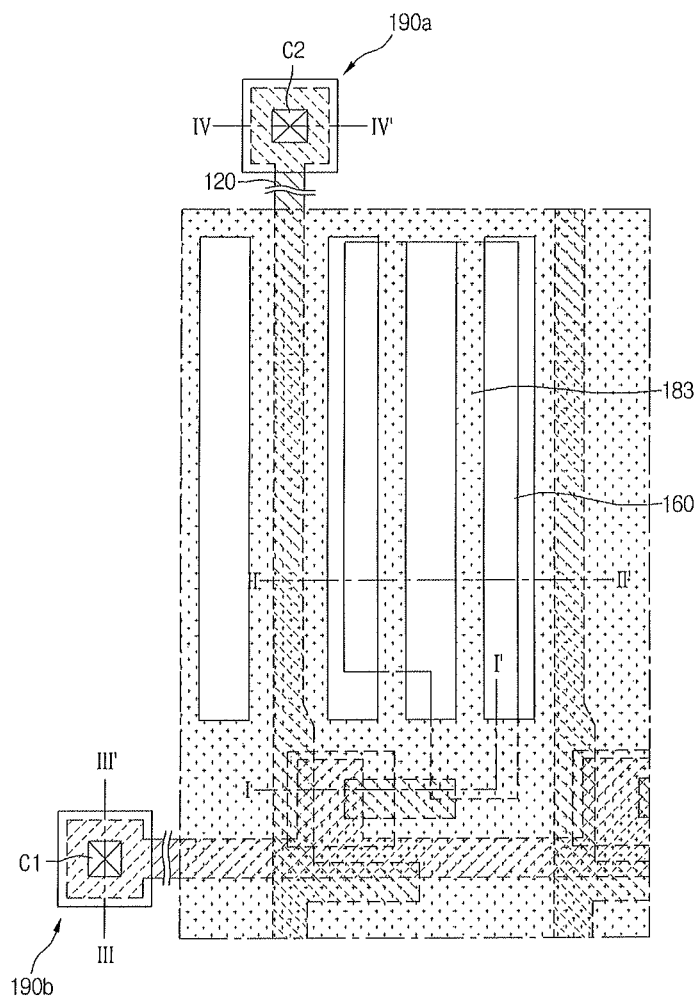
FIG. 1 is a planar view showing a unit pixel which is included in a thin film transistor substrate according to a first embodiment of the present disclosure.

In the present disclosure, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings. In the drawings, the sides of elements can be exaggerated for clarity, but they do not mean the practical sizes of elements.

Reference will now be made in detail to the embodiments of the present disclosure, examples of which are illustrated in the accompanying drawings.

Figure 2:
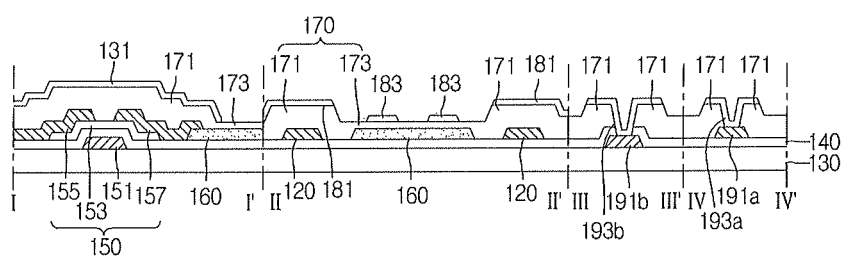
FIG. 2 is a cross-sectional view showing the thin film transistor substrate taken along lines I-I', II-II', III-III', and IV-IV' in FIG. 1.

FIG. 1 is a planar view showing a unit pixel which is included in a thin film transistor substrate according to a first embodiment of the present disclosure. FIG. 2 is a cross-sectional view showing the thin film transistor substrate taken along lines I-I', II-II', III-III', IV-IV' in FIG. 1;

As shown in FIGS. 1 and 2, a thin film transistor substrate according to an embodiment of the present disclosure includes a plurality of gate lines 110 and a plurality of data lines 120 which cross each other and define pixel regions, and thin film transistors 150 each formed at intersections of the gate and data lines 110 and 120. The thin film transistors 150 are used for each driving a liquid crystal cell.

Gate pads 190b are formed at one end of the gate lines 110 and data pads 190a are formed at one end of the data lines 120. The gate pads 190b are electrically connected to the respective gate lines 110. The data pads 190a are electrically connected to the respective data lines 120.

Each of the thin film transistor 150 includes a gate electrode 151 formed on a base substrate 130, and a part of a gate insulation layer 140 formed on the gate electrode 151 and the base substrate 130. Each of the thin film transistor 150 further includes a semiconductor pattern 153 formed on the gate insulation layer 140, and source/drain electrodes 155 and 157 formed on the semiconductor pattern 153.

Pixel electrodes 160 are formed on the pixel regions, respectively. The drain electrode 157 is electrically connected to the pixel electrode 160. The drain electrode 157 can be formed after the pixel electrode 160 is prepared. In this case, the drain electrode 160 overlaps a part of the pixel electrode 160 and is in direct contact with the pixel electrode 160 without forming any contact hole.

A passivation (protective) layer 170 is formed on the source/drain electrodes 155 and 157, the data lines 120 and the gate insulation layer 140. The passivation layer 170 includes first portions 171 and second portions 173. The first portion 171 is formed on the gate insulation layer 140 opposite to the source/drain electrodes 155 and 157, data lines 120, gate lines 110, gate pads 190b, and data pads 190a. The second portion is formed on the gate insulation layer 120 opposite to the pixel electrodes 160. A common electrode wiring 181 is formed on the first portion 171.

The pixel electrode 160 is covered with the second portion 173 which is thinner than the first portion 171. As an example, the second portion 173 is prepared by etching the first portion 171 through a photolithography process using a half tone mask or a diffraction mask.

The second portion 173 forms a stepped structure along the boundary with the first portion 171. In other words, the stepped structure is formed along the edge of the pixel electrode 160.

Such a second portion 173 can be formed through the photolithography process which uses the half tone mask or diffraction mask. The second portion 173 can be simultaneously formed when a contact hole for the gate pad and/or the data pad is formed in the first portion 171.

A common electrode pattern 183 is formed on the second portion 173. The common electrode pattern 183 is configured to have a slit structure extending from the common electrode wiring 181.

The gate pad 190b includes a lower gate pad electrode 191b and an upper gate pad electrode 193b. The lower gate pad electrode 191b is simultaneously formed with the gate electrode 151. The upper gate pad electrode 193b is simultaneously formed with the common electrode wiring 181 and the common electrode pattern 183.

The lower gate pad electrode 191b is externally exposed by a first contact hole C1. The first contact hole C1 is formed through the photolithography process which forms the first and second portions 171 and 173 of the passivation layer 170 using the half tone mask or diffraction mask.

The upper gate pad electrode 193b is formed on the first portion 171 of the passivation layer 170 which includes the exposed lower gate pad electrode 191b. As such, the upper gate pad electrode 193b is electrically connected to the lower gate pad electrode 191b.

The data pad 190a includes a lower data pad electrode 191a and an upper data pad electrode 193a. The lower data pad electrode 191a is simultaneously formed with the source/drain electrodes 155 and 157 and the data line 120. The upper data pad electrode 193a is simultaneously formed with the common electrode wiring 181 and the common electrode pattern 183.

The lower data pad electrode 191a is externally exposed by a second contact hole C2. The second contact hole C2 is formed through the photolithography process which forms the first and second portions 171 and 173 of the passivation layer 170 using the half tone mask or the diffraction mask.

The upper data pad electrode 193a is formed on the first portion 171 of the passivation layer 170 which includes the exposed lower data pad electrode 191a. As such, the upper data pad electrode 193a is electrically connected to the lower data pad electrode 191a.

In this manner, the thin film transistor substrate of this embodiment allows the passivation layer 170 to include the first and second portions 171 and 173 which are formed in different thicknesses according to regions. More specifically, the gate and data lines 110 and 120 and the common electrode wiring 181, which overlap each other, maintain a constant distance by the first portion 171 so as to reduce the parasitic capacitance. Also, the distance between the pixel electrode 160 and the common electrode pattern overlapping each other is minimized by the second passivation layer 17, thereby enlarging the storage capacitance Cst. As a result, the thin film transistor substrate of this embodiment not only prevents a vertical crosstalk fault but also reduces power consumption.

Such a thin film transistor substrate according to the first embodiment of the present disclosure not only maintains the distance between the gate and data lines 110 and 120 and the common electrode wiring 181 but also reduces the distance between the pixel electrode 160 and the common electrode pattern 183. As such, the thin film transistor substrate increases the electric field generated between the pixel electrode 160 and the common electrode pattern 183 so that the driving voltage of the liquid crystal is lowered. Therefore, the thin film transistor substrate used as a lower substrate of the LCD device can reduce power consumption of the LCD device.

Moreover, the thin film transistor substrate according to the first embodiment of the present disclosure can prevent capacity poverty of a storage capacitor Cst caused by a small overlapping area of the pixel electrode 160 and the common electrode pattern 183 in a WVGA high-definition model. Therefore, the thin film transistor substrate can prevent flicker, crosstalk, and other phenomena which are generated by the poor storage capacity Cst in the WVGA high-definition model.

FIGS. 3A to 8B are planar views and cross sectional views illustrating a method of manufacturing a thin film transistor substrate according to a first embodiment of the present disclosure.

Figure 3A:
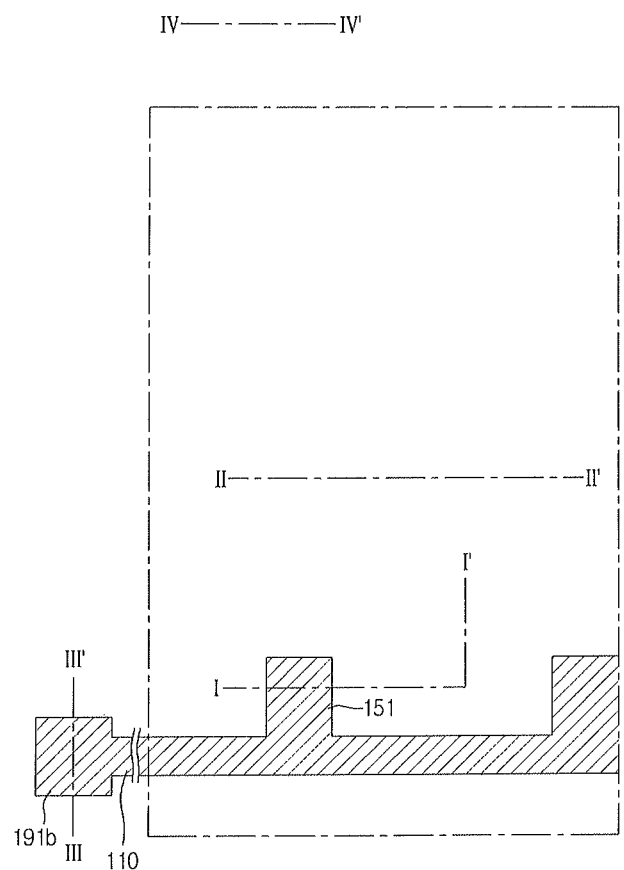
FIGS. 3A to 8B are planar views and cross sectional views illustrating a method of manufacturing a thin film transistor substrate according to a first embodiment of the present disclosure.
Figure 3B:
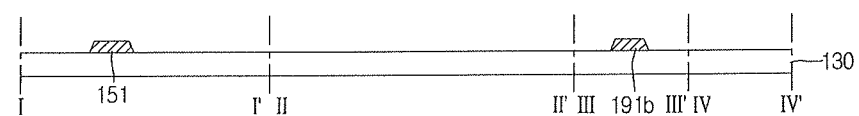

Referring to FIGS. 3A and 3B, a gate electrode 151, a gate line 110 and a lower gate pad electrode 191b are formed on a base substrate 130. As an example, the gate electrode 151, the gate line 110 and the lower gate pad electrode 191b are prepared by forming a metal layer on the base substrate 151 and patterning the metal layer through a photolithography process using a mask.

The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 4A:
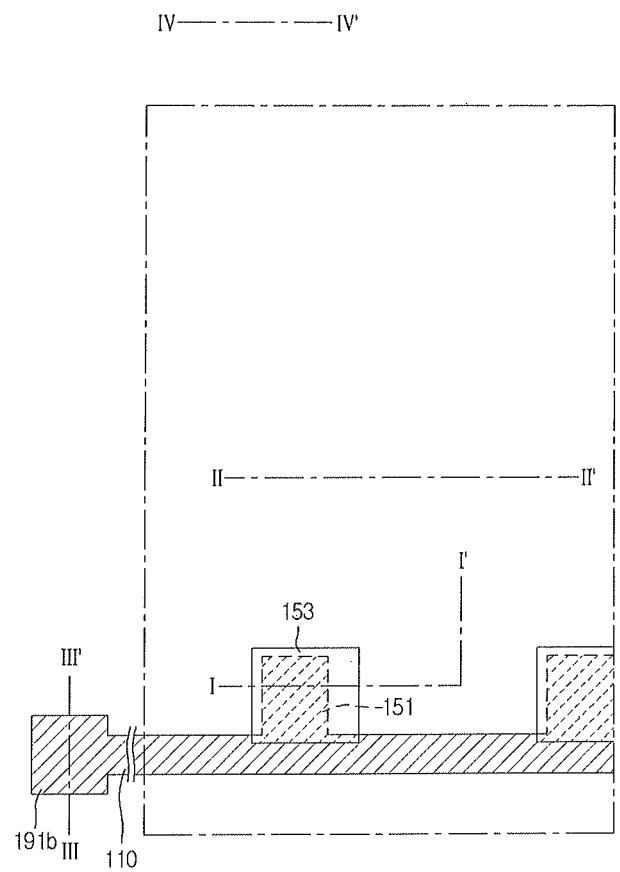
Figure 4B:
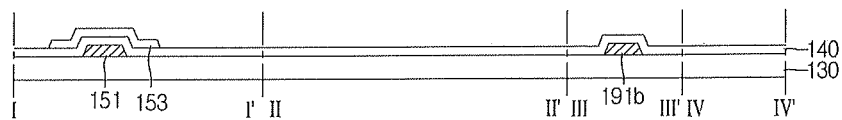

Subsequently, a gate insulation layer 140 is formed on the base substrate 130 which is provided with the gate electrode 151, the gate line 110, and the lower gate pad electrode 191b, as shown in FIGS. 4A and 4B. Also, a semiconductor pattern 153 is formed on the gate insulation layer 140 opposite to the gate electrode 151. As an example, the semiconductor pattern 153 is prepared by forming a semiconductor layer on the gate insulation layer 140 and patterning the semiconductor layer through a photolithography process using a mask.

Figure 5A:
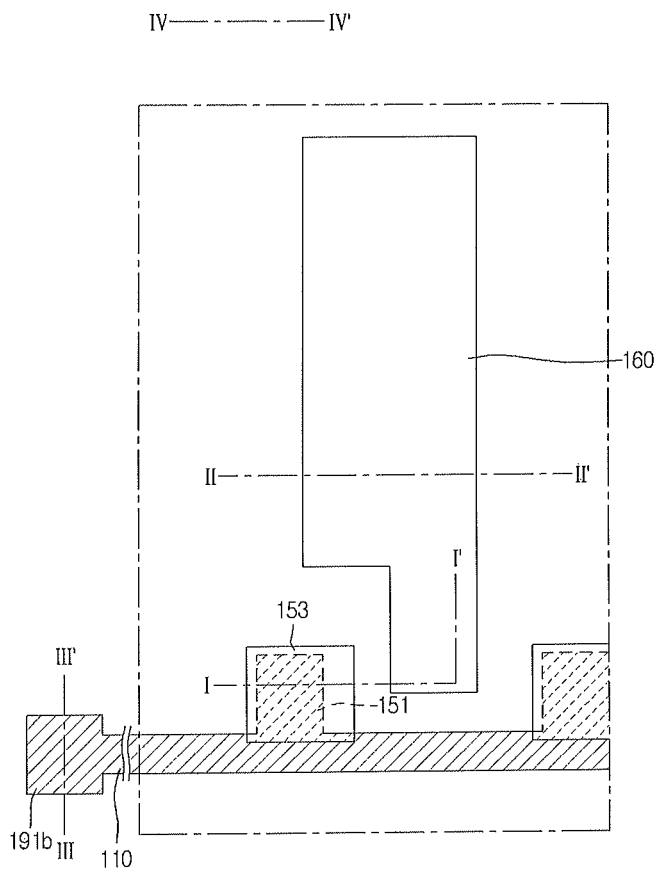
Figure 5B:
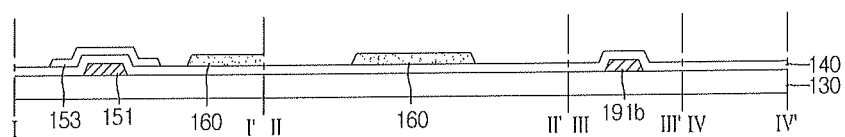

As shown in FIGS. 5A and 5B, a pixel electrode 160 of the planar type (or the two-dimensional type) is formed within a pixel region. As an example, the pixel electrode 160 is prepared by forming a transparent metal layer on the gate insulation layer 140 including the semiconductor pattern 153 and by patterning the transparent metal layer through a photolithography process using a mask. The transparent metal layer can include one selected from a group including transparent metal materials, such as ITO (Indium Tin Oxide), ZnO (Zinc Oxide) and IZO (Indium Zinc Oxide), and alloys containing at least two thereof.

Figure 6A:
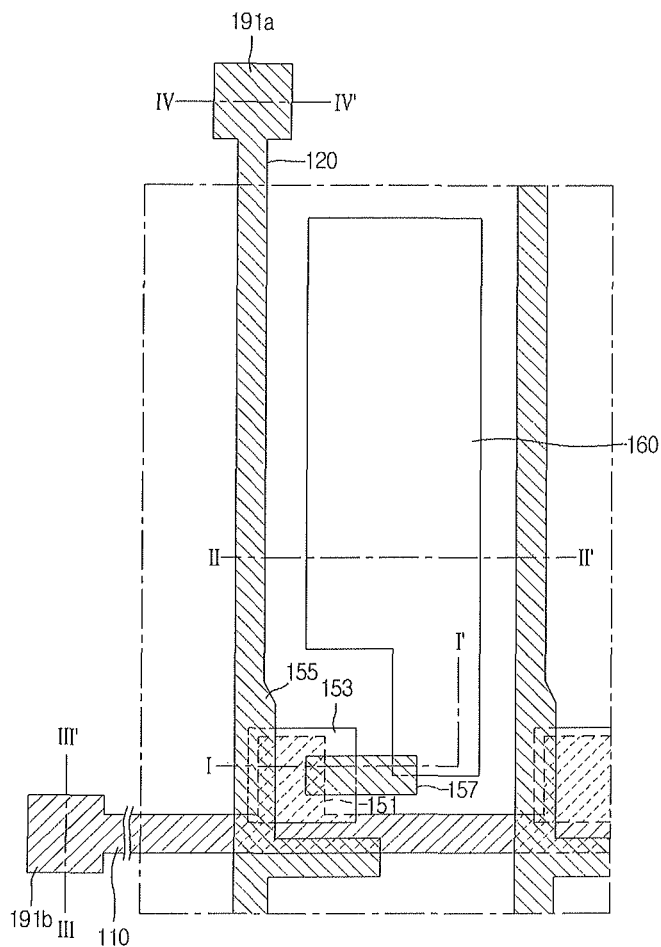
Figure 6B:
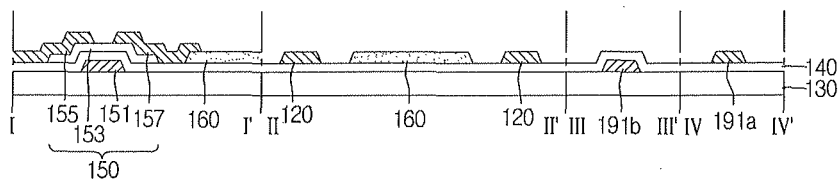

Referring to FIGS. 6A and 6B, source/drain electrodes 155 and 157 are formed on the semiconductor pattern 153 and a data line 120 is formed along one edge of the pixel region. As an example, the source/drain electrodes 155 and 157 and the data line 120 are prepared by forming a metal layer on the gate insulation layer including the semiconductor pattern 153 and the pixel electrode 160 and by patterning the metal layer through a photolithography process using a mask. A lower data pad electrode 191a is also provided at one end of the data line 120. The lower data pad electrode 191a is simultaneously formed with the data line 120 and the source/drain electrodes 155 and 157. The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 7A:
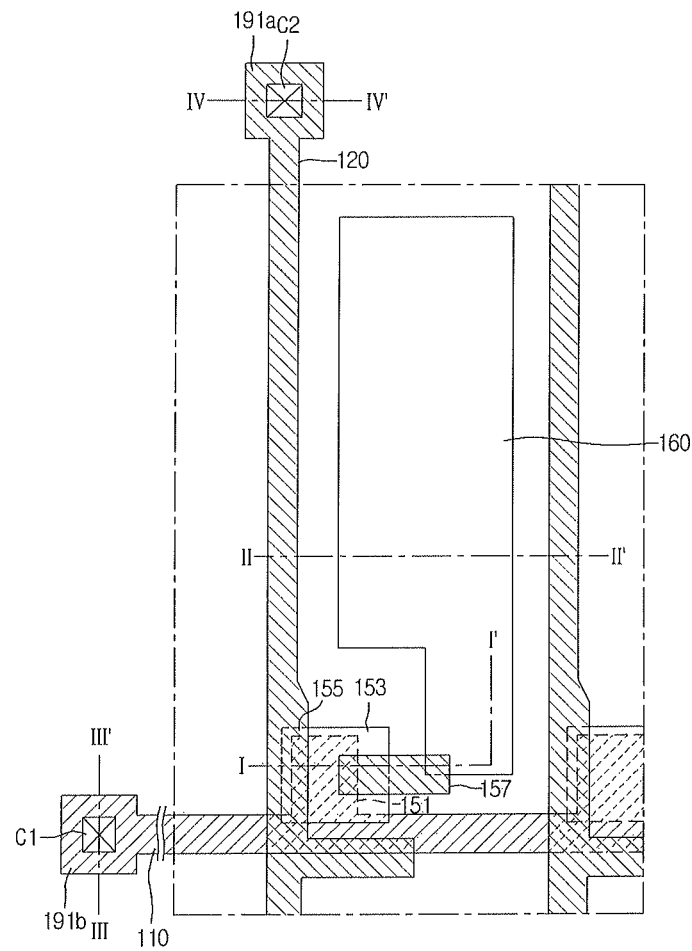
Figure 7B:
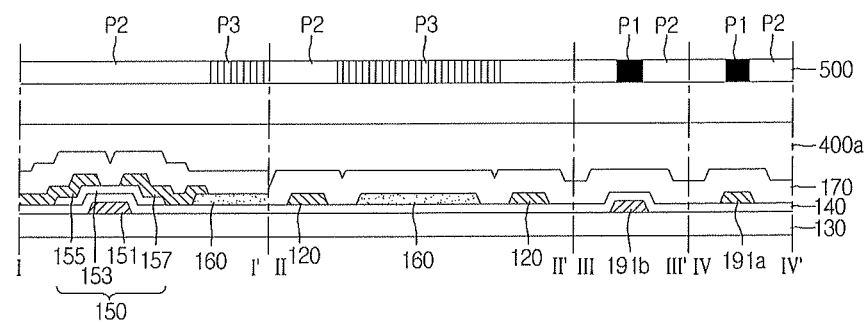
Figure 7C:
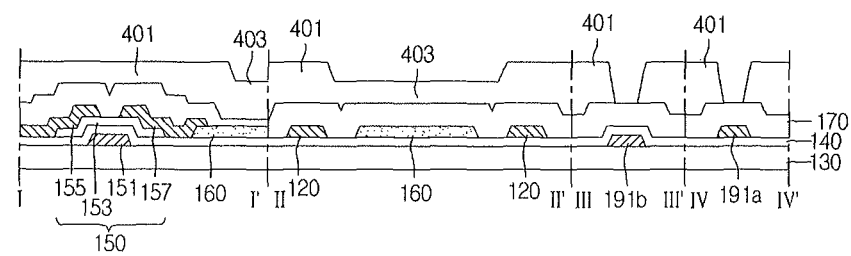

A passivation layer 170 of a constant thickness is formed on the gate insulation layer 140 including the semiconductor pattern 153, the source/drain electrodes 155 and 157, the data line 120, the lower data pad electrode 191a and the pixel electrode 160, as shown in FIGS. 7B and 7C. Also, first and second photo resist patterns 401 and 403 shown in FIG. 7C are formed on the passivation layer 170. The first and second photo resist patterns 401 and 403 are prepared by forming a photo resist layer 400a on the passivation layer 170 and exposing and developing the photo resist layer 400a using a mask 500, as shown in FIG. 7B.

The mask 500 can become a half tone mask or a diffraction mask. Such a mask 500 includes an interception region P1 intercepting light (or ultraviolet rays), a semi-transmission region P3 allowing a part of light to be penetrated through, and a transmission region P2 enabling light to be fully penetrated through.

The exposing and developing process using the-above mentioned mask 500 forces the photo resist layer 400a to be partially and completely removed in the thickness direction according to a region. In accordance therewith, the first and second photo resist patterns 401 and 403 with different thicknesses from each other are formed.

Figure 7D:
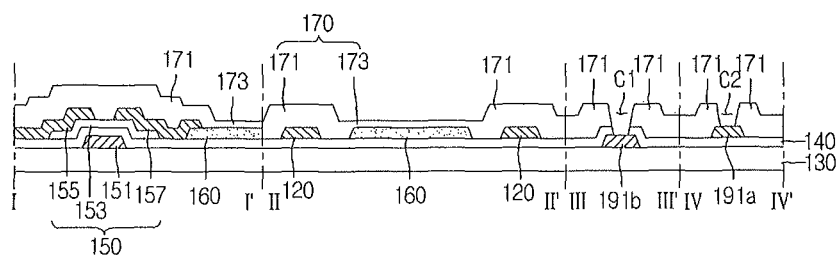

The lower gate and data pad electrodes 191b and 191a are partially exposed to the exterior by first and second contact holes C1 and C2, as shown in FIGS. 7A and 7D. The first and second contact holes C1 and C2 are formed through an etching process of removing the passivation layer 170 opposite to the regions from which the photo resist layer 400a is completely removed from in the thickness direction. More specifically, the lower gate pad electrode 191b is externally exposed by the first contact hole C1, and the lower data pad electrode 191a is externally exposed by the second contact hole C2.

Also, the passivation layer 170 is patterned using the first photo resist pattern 401 on a region corresponding to the pixel electrode 160 and the second photo resist pattern 402 on the other region not corresponding to the pixel electrode 160. As such, the passivation layer 170 is divided to have first and second portion 171 and 173 with different thicknesses from each other.

The second portion 173 in the pixel region corresponding to the pixel electrode 160 allows a stepped structure to be formed along a boundary with the first portion 171 which is positioned in another region excluding the pixel region 160. In other words, the second portion 173 has a thinner thickness than that of the first portion 171.

Figure 8A:
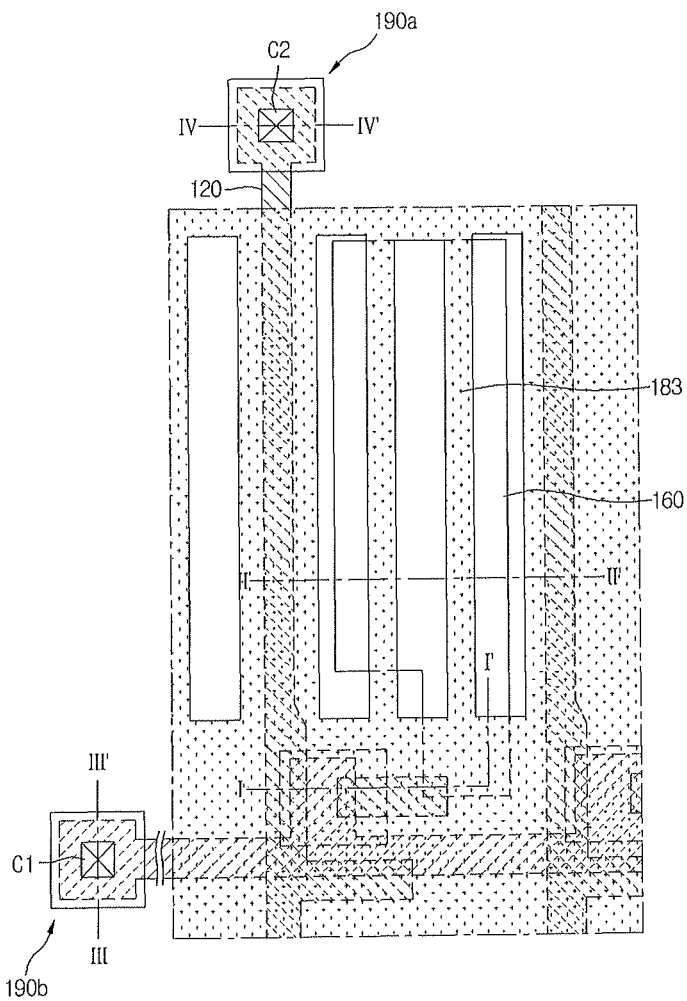
Figure 8B:
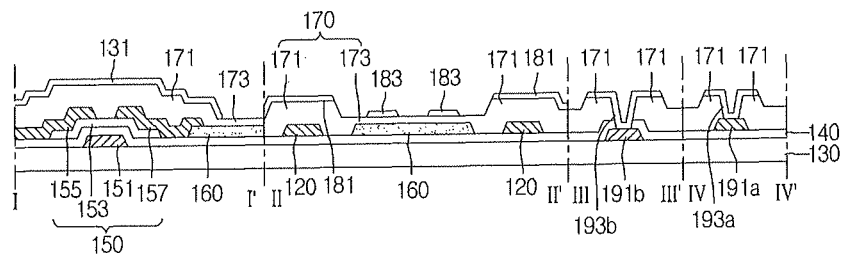

As shown in FIGS. 8A and 8B, a common electrode wiring 181 is formed on the first portion 171, and a common electrode pattern 183 is formed on the region corresponding to the pixel electrode 160 (i.e., on the second portion 173). As an example, the common electrode wiring 181 and the common electrode pattern 183 are prepared by forming a transparent metal layer on the first and second portions 171 and 173 of the passivation layer 170 and patterning the transparent metal layer through a photolithography process using a mask. Also, an upper gate pad electrode 193b is formed on the lower gate pad electrode 191b, and an upper data pad electrode 193a is formed in the lower data pad electrode 191a. The transparent metal layer can include one selected from a group including transparent metal materials, such as ITO (Indium Tin Oxide), ZnO (Zinc Oxide) and IZO (Indium Zinc Oxide), and an alloy containing at least two thereof.

In this way, the manufacturing method of the thin film transistor substrate according to a first embodiment of the present embodiment allows a part of the passivation layer 170 opposite to the pixel electrode 160 to be etched by a constant thickness, when the contact holes for the gate and data pads is formed through the photolithography process using the half tone mask or the diffraction mask, thereby forming the first and second portions 171 and 173. As such, the distance between the pixel electrode 160 and the common electrode pattern 183 is reduced and the distance between the gate and data lines 110 and 120 and the common electrode wiring 181 is constantly maintained. As a result, the LCD device can reduce not only the parasitic capacitance but also the power consumption by enlarging the storage capacitance.

Figure 9:
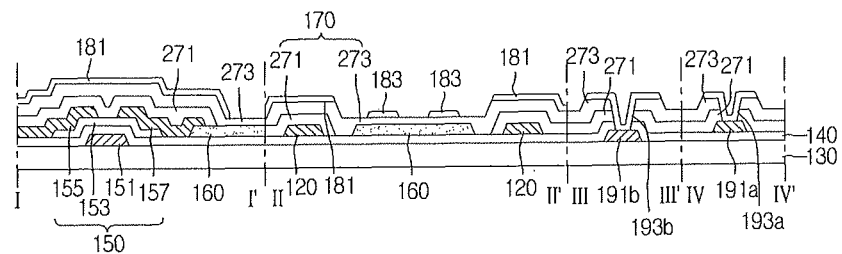
FIG. 9 is a cross sectional view showing a thin film transistor substrate according to a second embodiment of the present disclosure.

FIG. 9 is a cross sectional view showing a thin film transistor substrate according to a second embodiment of the present disclosure.

The thin film transistor substrate of FIG. 9 according to the second embodiment has the same configuration as that of the first embodiment described above, with the exception of a passivation layer 270. Accordingly, the description of the first embodiment to be repeated in the second embodiment of the present disclosure will be omitted. Also, the thin film transistor substrate according to the second embodiment of the present disclosure will refer to the same reference numbers for the same elements as that according to the first embodiment.

The thin film transistor substrate according to the second embodiment of the present disclosure includes a first passivation layer 271 formed on the gate insulation layer 150, which is provided with the semiconductor pattern 153, the source/drain electrodes 155 and 157, the data line 120 and the pixel electrode 160, except for the region corresponding to the pixel electrode 160. The first passivation layer 271 is prepared by forming the first passivation layer 271 on the entire surface of the gate insulation layer 140, which includes the semiconductor pattern 153, the source/drain electrodes 155 and 157, the data line 120 and the pixel electrode, and by etching the first passivation layer 271 within the region corresponding to the pixel electrode 160 through a photo lithography process using a mask. At this time, the first passivation layer 271 within the region corresponding to the pixel electrode 160 is completely removed.

A second passivation layer 273 is formed on the first passivation layer 271 and the pixel electrode 160. Also, a common electrode wiring 181 and a common electrode pattern 183 are formed on the second passivation layer 273.

In this manner, the thin film transistor substrate according to the second embodiment of the present disclosure constantly maintains the distance between the gate and data line 110 and 120 and the common electrode wiring 181 using a stacked layer structure (i.e., the passivation layer 270) which includes the first and second passivation layers 271 and 273. As such, the parasitic capacitance in the thin film transistor substrate is reduced. Also, the thin film transistor substrate minimizes the distance between the pixel electrode 160 and the common electrode pattern 183 using only the second passivation layer 273, so that the storage capacitance increases. In other words, the distance between the pixel electrode 160 and the common electrode pattern 183 can be designed to become smaller than that between the gate or data line 110 or 120 and the common electrode wiring 181.

As described above, the thin film transistor substrate according to the second embodiment of the present disclosure not only maintains the distances between the gate and data lines 110 and 120 and the common electrode wiring 181 but also reduces the distance between the pixel electrode 160 and the common electrode pattern 183. As such, the thin film transistor substrate increases the electric field generated between the pixel electrode 160 and the common electrode pattern 183 so that the driving voltage of the liquid crystal is lowered. Therefore, the thin film transistor substrate used as a lower substrate of the LCD device can reduce power consumption of the LCD device.

Moreover, the thin film transistor substrate according to a second embodiment of the present disclosure can prevent capacity poverty of a storage capacitor Cst caused by a small overlapping area of the pixel electrode 160 and the common electrode pattern 183 in a WVGA high-definition model. Therefore, the thin film transistor substrate can prevent flicker, crosstalk, and other phenomena which are generated by the poor storage capacitor Cst in the WVGA high-definition model.

FIGS. 10A to 10I are cross sectional views illustrating a method of manufacturing a thin film transistor substrate according to a second embodiment of the present disclosure.

Figure 10A:
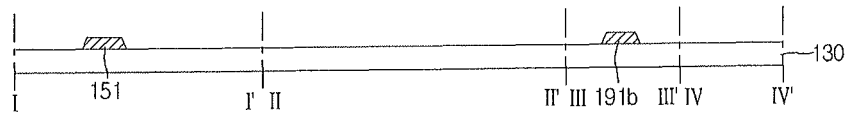
FIGS. 10A to 10I are cross sectional views illustrating a method of manufacturing a thin film transistor substrate according to a second embodiment of the present disclosure.

Referring to FIG. 10A, a gate electrode 151, a gate line (not shown), and a lower gate pad electrode 191b are formed on a base substrate 130. As an example, the gate electrode 151, the gate line, and the lower gate pad electrode 191b are prepared by depositing a metal layer on the base substrate 151 and patterning the metal layer through a photolithography process using a mask. The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 10B:
Figure 10C:
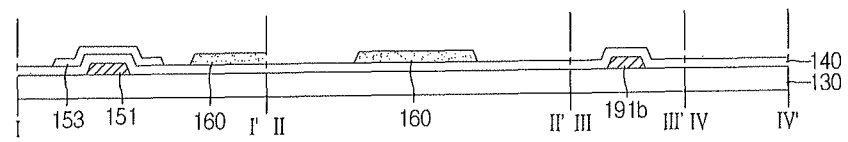

Thereafter, a gate insulation layer 140 is formed on the base substrate 130 which is provided with the gate electrode 151, the gate line, and the lower gate pad electrode 191b, as shown in FIG. 10B. Also, a semiconductor pattern 153 is formed on the gate insulation layer 140 opposite to the gate electrode 151. As an example, the semiconductor pattern 153 is prepared by forming a semiconductor layer on the gate insulation layer 140 and patterning the semiconductor layer through a photolithography process using a mask.

As shown in FIG. 10O, a pixel electrode 160 of the planar type (or the two-dimensional type) is formed within a pixel region. As an example, the pixel electrode 160 is prepared by forming a transparent metal layer on the gate insulation layer 140 including the semiconductor pattern 153 and by patterning the metal layer through a photolithography process using a mask. The transparent metal layer can include one selected from a group including transparent metal materials, such as ITO (Indium Tin Oxide), ZnO (Zinc Oxide) and IZO (Indium Zinc Oxide), and alloys containing at least two thereof.

Figure 10D:
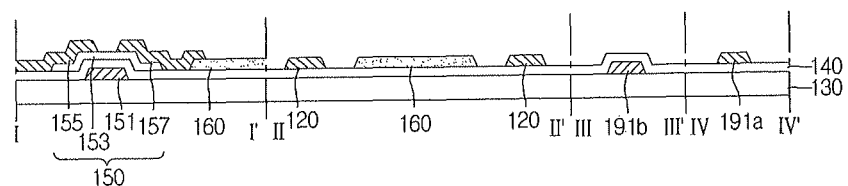

Referring to FIG. 10D, source/drain electrodes 155 and 157 are formed on the semiconductor pattern 153 and a data line 120 is formed along one edge of the pixel region. As an example, the source/drain electrodes 155 and 157 and the data line 120 are prepared by forming a metal layer on the gate insulation layer including the semiconductor pattern 153 and the pixel electrode 160 and by patterning the metal layer through a photolithography process using a mask. A lower data pad electrode 191a is also provided at one end of the data line 120. The lower data pad electrode 191a is simultaneously formed with the data line 120 and the source/drain electrodes 155 and 157. The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 10E:
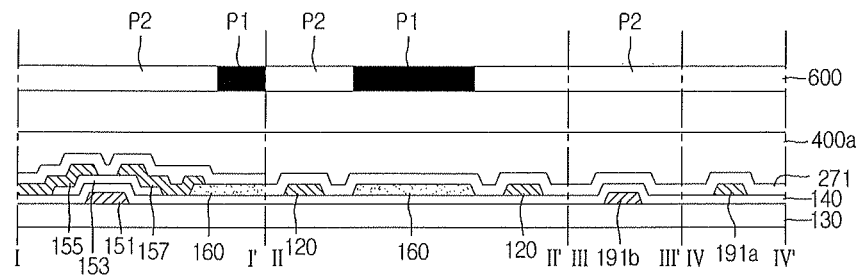

A first passivation layer 271 of a constant thickness is formed on the gate insulation layer 140 including the semiconductor pattern 153, the source/drain electrodes 155 and 157, the data line 120, the lower data pad electrode 191a and the pixel electrode 160, as shown in FIG. 10E. Also, a photo resist layer 400a is formed on the passivation layer 170. The photo resist patterns 400a is patterned an exposing and developing process using a mask 600, thereby providing a photo resist pattern (not shown).

The mask 600 includes interception regions P1 and transmission regions P2. The interception region P1 is used in intercepting light (or ultraviolet rays), and the transmission region P2 enables light to be fully penetrated through.

Figure 10F:
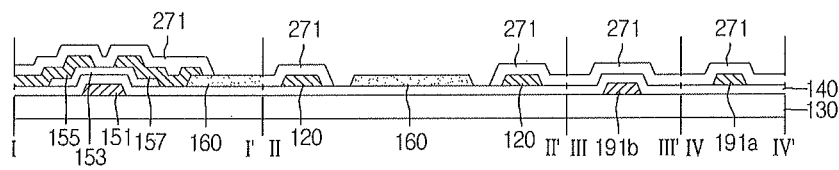

As shown in FIG. 10F, a part of the first passivation layer 271 opposite to the pixel electrode 160 is removed through an etching process which uses the photo resist pattern as an etch mask. As such, the pixel electrode 160 is externally exposed through the etched part of the first passivation layer 271. After the first passivation layer 271 is partially etched, the photo resist pattern is removed.

Figure 10G:
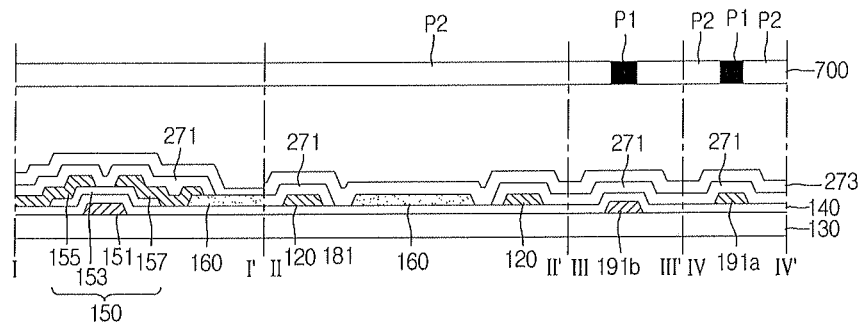
Figure 10H:
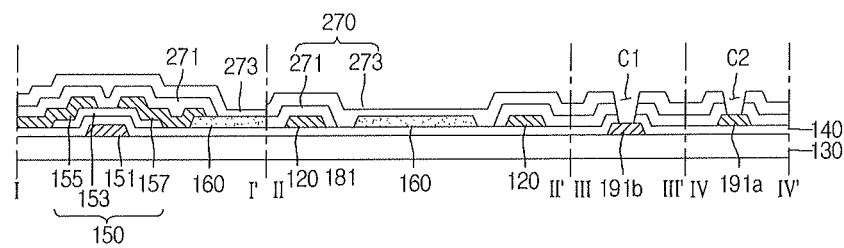

Referring to FIGS. 10G and 10H, a second passivation layer 273 and another photo resist layer (not shown) are sequentially formed on the first passivation layer 271 including the pixel electrode 160, and then first and second contact holes C1 and C2 is formed through a photolithography process using a mask 700. The first contact hole C1 is prepared by sequentially removing the second and first passivation layers 273 and 271 and the gate insulation layer 140. The second contact hole C2 is prepared by sequentially removing the second and first passivation layer 273 and 271.

The mask 700 includes interception regions P1 and transmission regions P2. The interception region P1 is used in intercepting light (or ultraviolet rays), and the transmission region P2 enables light to be fully penetrated through.

The lower gate pad electrode 191b is externally exposed by the first contact hole C1. The lower data pad electrode 191a is externally exposed by the second contact hole C2.

Figure 10I:
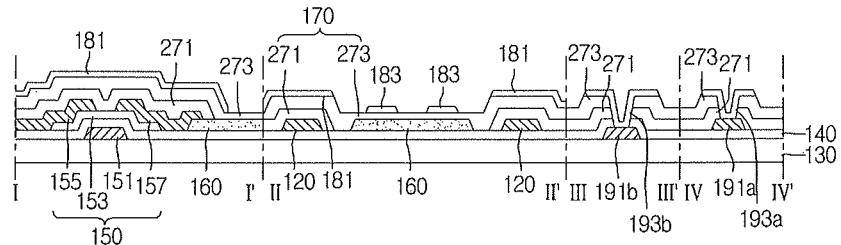

As shown in FIG. 10I, a common electrode wiring 181 and common electrode pattern 183 are formed on the second passivation layer 273. The common electrode pattern 183 is formed on a region of the second passivation layer 273 opposite to the pixel electrode 160. As an example, the common electrode wiring 181 and the common electrode pattern 183 are prepared by forming a transparent metal layer on the second passivation layer 273 including the first and second contact holes C1 and C2 and patterning the transparent metal layer through a photolithography process using still another mask. Also, an upper gate pad electrode 193b is formed on the lower gate pad electrode 191b, and an upper data pad electrode 193a is formed on the lower data pad electrode 191a.

In this way, the thin film transistor substrate according to the second embodiment of the present disclosure, which is manufactured through the processes illustrated in FIGS. 10A to 10I, can constantly maintain the distances of the gate and data lines 110 and 120 and the source/drain electrodes 155 and 157 with respect to the common electrode wiring 181, using the first and second passivation layers 271 and 273. Also, the thin film transistor substrate minimizes the distance between the pixel electrode 160 and the common electrode pattern 183 by removing a part of the first passivation layer 271 corresponding to the pixel region, so that an electric field between the pixel electrode 160 and the common electrode pattern 183 becomes larger. As such, a voltage driving the liquid crystal becomes lower. Therefore, electric power consumption of the thin film transistor substrate can be reduced.

Furthermore, the thin film transistor substrate according to the second embodiment of the present disclosure can prevent capacity poverty of a storage capacitor Cst caused by a small overlapping area of the pixel electrode 160 and the common electrode pattern 183 in a WVGA high-definition model. Therefore, the thin film transistor substrate can prevent flicker, crosstalk, and other phenomena which are generated by the poor storage capacity Cst in the WVGA high-definition model.

Figure 11:
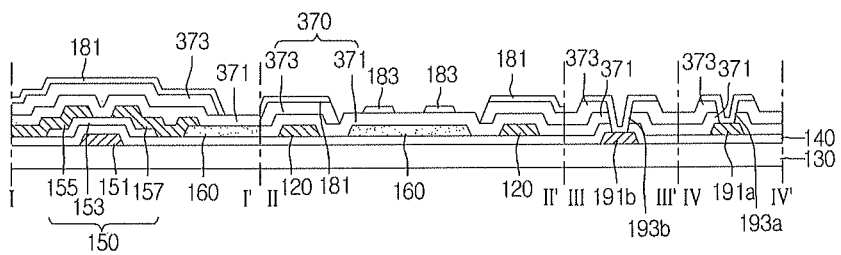
FIG. 11 is a cross sectional view showing a thin film transistor substrate according to a third embodiment of the present disclosure.

FIG. 11 is a cross sectional view showing a thin film transistor substrate according to a third embodiment of the present disclosure.

The thin film transistor substrate according to the third embodiment, as shown in FIG. 11, has the same configuration as that of the first embodiment described above, with the exception of a passivation layer 370. Accordingly, the description of the first embodiment to be repeated in the third embodiment of the present disclosure will be omitted. Also, the thin film transistor substrate according to the third embodiment of the present disclosure will refer to the same reference numbers for the same elements as that according to the first embodiment.

The thin film transistor substrate according to the third embodiment of the present disclosure includes first and second passivation layers 371 and 373 sequentially deposited on the gate insulation layer 150, which is provided with the semiconductor pattern 153, the source/drain electrodes 155 and 157, the data line 120 and the pixel electrode 160. A part of the second passivation layer 373 opposite to the region (i.e., the pixel region) corresponding to the pixel electrode 160 is completely etched by a photolithography process which uses a half tone mask or a diffraction mask. In other words, only the first passivation layer 371 remains within the region corresponding to the pixel electrode 160 because the second passivation layer 373 is completely removed from the pixel region.

A common electrode pattern 183 is formed on the first passivation layer 371 within the region corresponding to the pixel electrode 160. Also, a common electrode wiring 181, an upper gate pad electrode 193b, and an upper data pad electrode 193a are formed on the second passivation layer 373.

In this manner, the thin film transistor substrate according to the second embodiment of the present disclosure constantly maintains the distances of the gate and data line 110 and 120 with respect to the common electrode wiring 181 using a stacked layer structure (i.e., the passivation layer 370) which includes the first and second passivation layers 371 and 373. As such, the parasitic capacitance in the thin film transistor substrate is reduced. Also, the thin film transistor substrate minimizes the distance between the pixel electrode 160 and the common electrode pattern 183 using only the first passivation layer 371, so that the storage capacitance increases. In other words, the distance between the pixel electrode 160 and the common electrode pattern 183 can be designed to become smaller than those of the gate line 110, data line 120 and source/drain electrodes with respect to the common electrode wiring 181.

As described above, the thin film transistor substrate according to the second embodiment of the present disclosure not only maintains the distances of the gate and data lines 110 and 120 with respect to the common electrode wiring 181 but also reduces the distance between the pixel electrode 160 and the common electrode pattern 183. As such, the thin film transistor substrate increases the electric field generated between the pixel electrode 160 and the common electrode pattern 183 so that the driving voltage of the liquid crystal is lowered. Therefore, the thin film transistor substrate can reduce electric power consumption.

Moreover, the thin film transistor substrate according to third embodiment of the present disclosure can prevent capacity poverty of a storage capacitor Cst caused by a small overlapping area of the pixel electrode 160 and the common electrode pattern 183 in a WVGA high-definition model. Therefore, the thin film transistor substrate can prevent flicker, crosstalk, and other phenomena which are generated by the poor storage capacitor Cst in the WVGA high-definition model.

FIGS. 12A to 12G are cross sectional views illustrating a method of manufacturing a thin film transistor substrate according to a third embodiment of the present disclosure.

Figure 12A:
FIGS. 12A to 12G are cross sectional views illustrating a method of manufacturing a thin film transistor substrate according to a third embodiment of the present disclosure.

Referring to FIG. 12A, a gate electrode 151, a gate line (not shown) and a lower gate pad electrode 191b are formed on a base substrate 130. As an example, the gate electrode 151, the gate line and the lower gate pad electrode 191b are prepared by depositing a metal layer on the base substrate 151 and patterning the metal layer through a photolithography process using a mask. The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 12B:

Subsequently, a gate insulation layer 140 is formed on the base substrate 130 which is provided with the gate electrode 151, the gate line, and the lower gate pad electrode 191b, as shown in FIG. 12B. Also, a semiconductor pattern 153 is formed on the gate insulation layer 140 opposite to the gate electrode 151. As an example, the semiconductor pattern 153 is prepared by forming a semiconductor layer on the gate insulation layer 140 and patterning the semiconductor layer through a photolithography process using a mask.

Figure 12C:
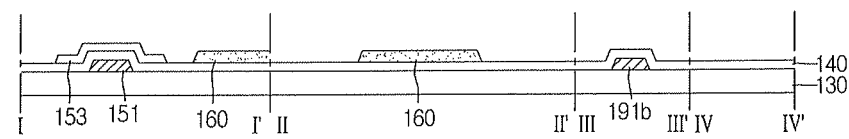

As shown in FIG. 12C, a pixel electrode 160 of the planar type (or the two-dimensional type) is formed within a pixel region. As an example, the pixel electrode 160 is prepared by forming a transparent metal layer on the gate insulation layer 140 including the semiconductor pattern 153 and by patterning the transparent metal layer through a photolithography process using another mask. The transparent metal layer can include one selected from a group including transparent metal materials, such as ITO (Indium Tin Oxide), ZnO (Zinc Oxide) and IZO (Indium Zinc Oxide), and alloys containing at least two thereof.

Figure 12D:
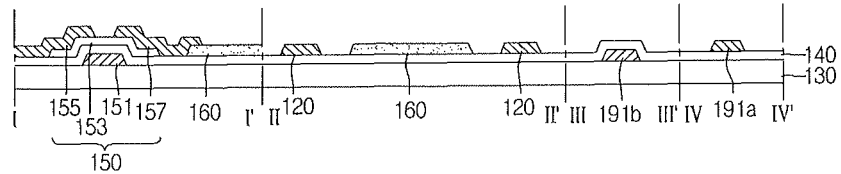

Referring to FIG. 12D, source/drain electrodes 155 and 157 are formed on the semiconductor pattern 153, and a data line 120 is formed along one edge of the pixel region. A lower data pad electrode 191a is also provided at one end of the data line 120. As an example, the source/drain electrodes 155 and 157, the data line 120, and the lower data pad electrode 191a are prepared by forming a metal layer on the gate insulation layer including the semiconductor pattern 153 and the pixel electrode 160 and by patterning the metal layer through a photolithography process using still another mask. The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 12E:
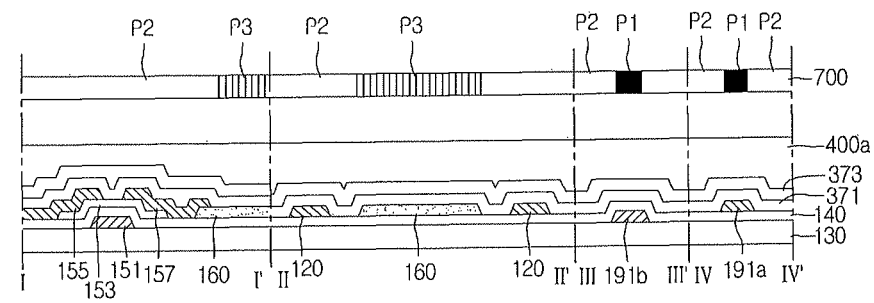

First and second passivation layers 371 and 373 formed in a constant thickness are stacked on the gate insulation layer 140 including the semiconductor pattern 153, the source/drain electrodes 155 and 157, the data line 120, the lower data pad electrode 191a and the pixel electrode 160, as shown in FIG. 12E. Also, a photo resist layer 400a is formed on the second passivation layer 373. The photo resist patterns 400a is patterned an exposing and developing process using further still another mask 700, thereby providing a photo resist pattern (not shown).

The mask 700 includes interception regions P1, semi-transmission regions P3, and transmission regions P2. The interception region P1 intercepts light (or ultraviolet rays). The semi-transmission region P3 allows a part of light to be penetrated through. The transmission region P2 enables light to be fully penetrated through.

Figure 12F:
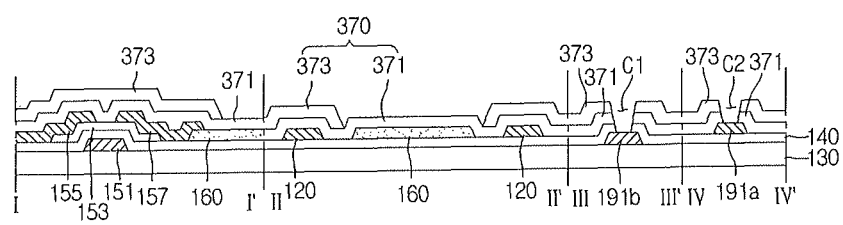

The exposing and developing process using the-above mentioned mask 700 forces the photo resist layer 400a to be partially and completely removed in the thickness direction according to a region. In accordance therewith, the photo resist pattern with different thicknesses according to a region is formed. Through an etching process using the photo resist pattern as an etch mask, the second passivation layer 373 on the pixel electrode 160 is completely removed so that only the first passivation layer remains within the region corresponding to the pixel electrode 160, as shown in FIG. 12F.

Also, first and second contact holes C1 and C2 are formed through the above-mentioned etching process. The first contact hole C1 is formed by sequentially removing the second and first passivation layers 373 and 371 and the gate insulation layer 140. The second contact hole C2 is formed by sequentially removing the second and first passivation layers 373 and 371. As such, the lower gate pad electrode 191b is externally exposed through the first contact hole C1, and the lower data pad electrode 191a is externally exposed through the second contact hole C2

Figure 12G:
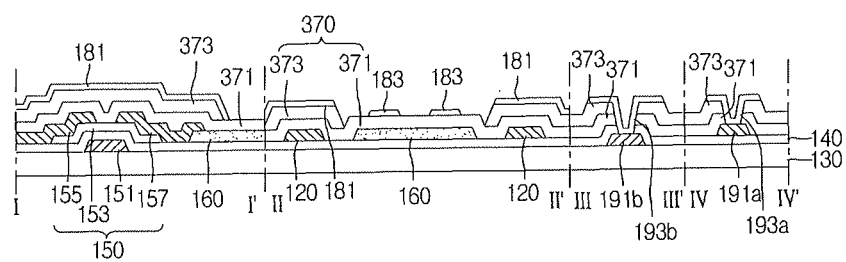

As shown in FIG. 12G, a common electrode wiring 181 is formed on the second passivation layer 373, and a common electrode pattern 183 is formed within the region corresponding to the pixel electrode 160 (i.e., on the exposed part of the first passivation layer 371). As an example, the common electrode wiring 181 and the common electrode pattern 183 are prepared by forming a transparent metal layer on the first and second passivation layers 371 and 373 provided with the first and second contact holes C1 and C2 and patterning the transparent metal layer through a photolithography process using furthermore another mask. Also, an upper gate pad electrode 193b is formed on the lower gate pad electrode 191b, and an upper data pad electrode 193a is formed in the lower data pad electrode 191a.

In this way, the thin film transistor substrate according to a third embodiment of the present embodiment, which is manufactured through the processes as illustrated in FIGS. 12A to 12G, can maintain the distances of the gate line, source/drain electrodes 155 and 157 and data line 120 with respect to the common electrode wiring 181 using the passivation layer 370 which includes the first and second passivation layers 371 and 373. Also, the thin film transistor substrate can reduce the distance between the pixel electrode 160 and the common electrode pattern 183 by removing the second passivation layer within the pixel region. As such, the thin film transistor substrate increases the electric field generated between the pixel electrode 160 and the common electrode pattern 183 so that the driving voltage of the liquid crystal is lowered. Therefore, the thin film transistor substrate can reduce power consumption.

Moreover, the thin film transistor substrate according to a second embodiment of the present disclosure can prevent capacity poverty of a storage capacitor Cst caused by a small overlapping area of the pixel electrode 160 and the common electrode pattern 183 in a WVGA high-definition model. Therefore, the thin film transistor substrate can prevent flicker, crosstalk, and other phenomena which are generated by the poor storage capacitor Cst in the WVGA high-definition model.

Figure 13:
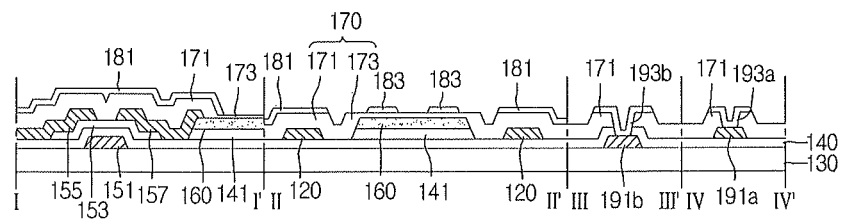
FIG. 13 is a cross sectional view showing a thin film transistor substrate according to a fourth embodiment of the present disclosure.

FIG. 13 is a cross sectional view showing a thin film transistor substrate according to a fourth embodiment of the present disclosure.

The thin film transistor substrate of FIG. 13 according to the fourth embodiment has the same configuration as that of the first embodiment described above, with the exception of a step-height compensation pattern 141. Accordingly, the description of the first embodiment to be repeated in the fourth embodiment of the present disclosure will be omitted. Also, the thin film transistor substrate according to the fourth embodiment of the present disclosure will refer to the same reference numbers for the same elements as that according to the first embodiment.

The thin film transistor substrate according to the fourth embodiment includes a step-height compensation pattern 141 formed in a region corresponding to a pixel electrode 160. The step-height compensation pattern 141 is formed on a gate insulation. The pixel electrode 160 is formed on the step-height compensation pattern 141.

Actually, a stepped structure is formed along the edges of a pixel region by a passivation layer 170 including first and second portions 171 and 173 which are formed to on the pixel region and the other region in different thicknesses from each other. However, the step-height compensation pattern 141 functions to prevent deterioration of image quality due to leakage of light caused by the stepped structure. In other words, the step-height compensation pattern 141 formed under the pixel electrode 160 compensates for the stepped structure which is formed in the edges of the pixel region by the first and second portions 171 and 173 of the passivation layer 170

Such a thin film transistor substrate according to the fourth embodiment of the present disclosure can constantly maintain the distances of the gate and data lines 110 and 120 with respect to the common electrode wiring 181 overlapping them. As such, a parasitic capacitance can be reduced. Also, the thin film transistor substrate minimizes the distance between the pixel electrode 160 and the common electrode pattern 183, which overlaps the pixel electrode 160, by the second portion 173 of the passivation layer 170. In accordance therewith, the thin film transistor substrate can increase the storage capacitance Cst. As a result, the thin film transistor substrate can prevent a vertical crosstalk fault and simultaneously reduce electric power consumption.

Also, the thin film transistor substrate according to the fourth embodiment of the present disclosure includes a step-height compensation pattern 141 formed between the pixel electrode 160 and the gate insulation layer 140 and configured to compensate for the stepped structure which is generated along the edges of the pixel region by the first and second portions 171 and 173 of the passivation layer 170. Accordingly, the thin film transistor substrate can prevent light leakage and enhance image quality.

Furthermore, the thin film transistor substrate according to the fourth embodiment of the present disclosure not only maintains the distances between the gate and data lines 110 and 120 and the common electrode wiring 181 but also reduces the distance between the pixel electrode 160 and the common electrode pattern 183. As such, the thin film transistor substrate increases a storage capacitance Cst between the pixel electrode 160 and the common electrode pattern 183 so that the driving voltage of the liquid crystal is lowered. Therefore, the thin film transistor substrate can reduce power consumption.

Moreover, the thin film transistor substrate according to the fourth embodiment of the present disclosure can prevent capacity poverty of a storage capacitor Cst caused by a small overlapping area of the pixel electrode 160 and the common electrode pattern 183 in a WVGA high-definition model. Therefore, the thin film transistor substrate can prevent flicker, crosstalk, and other phenomena which are generated by the poor storage capacitor Cst in the WVGA high-definition model.

FIGS. 14A to 14K are cross sectional views illustrating a method of manufacturing a thin film transistor substrate according to a fourth embodiment of the present disclosure.

Figure 14A:
FIGS. 14A to 14K are cross sectional views illustrating a method of manufacturing a thin film transistor substrate according to a fourth embodiment of the present disclosure.

Referring to FIG. 14A, a gate electrode 151, a gate line (not shown) and a lower gate pad electrode 191b are formed on a base substrate 130. As an example, the gate electrode 151, the gate line and the lower gate pad electrode 191b are prepared by forming a metal layer on the base substrate 151 and patterning the metal layer through a photolithography process using a mask. The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 14B:

Thereafter, a gate insulation layer 140 is formed on the base substrate 130 which is provided with the gate electrode 151, the gate line and the lower gate pad electrode 191b, as shown in FIG. 14B. Also, a semiconductor pattern 153 is formed on the gate insulation layer 140 opposite to the gate electrode 151. As an example, the semiconductor pattern 153 is prepared by forming a semiconductor layer on the gate insulation layer 140 and patterning the semiconductor layer through a photolithography process using another mask.

Figure 14C:
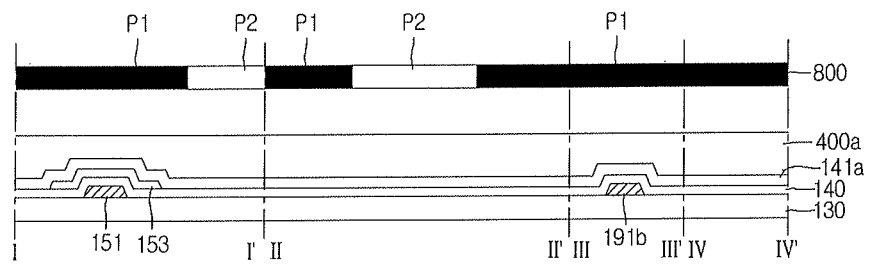
Figure 14D:
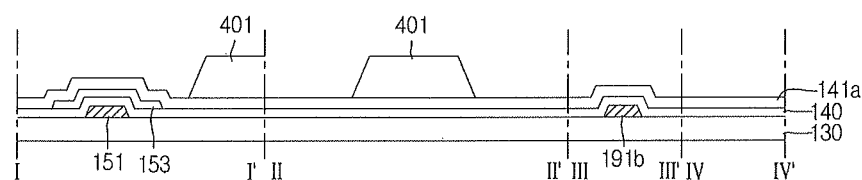
Figure 14E:
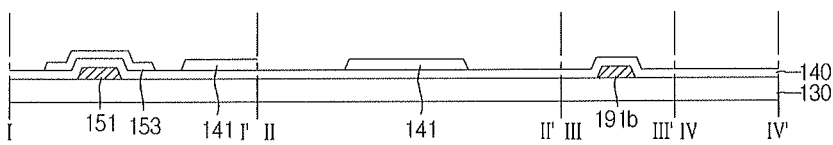

As shown in FIG. 14C, an insulation layer 141a and a photo resist layer 400a are sequentially formed on the gate insulation layer 140 provided with the semiconductor pattern 153. The photo resist layer 400a is patterned into a photo resist pattern 401 through an exposing and developing process using still another mask 800, as shown in FIG. 14D. The mask 800 includes an interception region P1 intercepting light (or ultraviolet rays) and a transmission region P2 enabling light to be fully penetrated through. A step-height compensation pattern 141 is formed on the pixel region through a process which etches the insulation layer 141a using the photo resist pattern 401 as an etch mask, as shown in FIG. 14E.

Figure 14F:
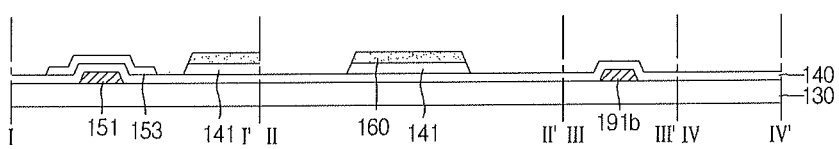

Subsequently, a pixel electrode 160 of the planar type (or the two-dimensional type) is formed within a pixel region, as shown in FIG. 14F. As an example, the pixel electrode 160 is prepared by forming a transparent metal layer on the gate insulation layer 140 including the semiconductor pattern 153 and the step-height compensation pattern 141 and by patterning the transparent metal layer through a photolithography process using further still another mask. More specifically, the pixel electrode 160 is formed directly on the step-height compensation pattern 141. The transparent metal layer can include one selected from a group including transparent metal materials, such as ITO (Indium Tin Oxide), ZnO (Zinc Oxide) and IZO (Indium Zinc Oxide), and alloys containing at least two thereof.

Figure 14G:
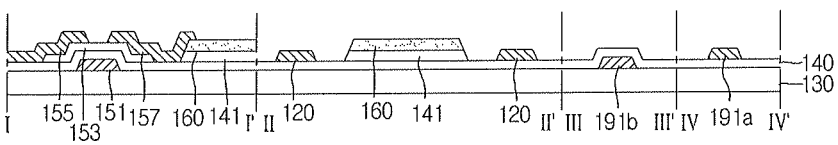

Referring to FIG. 14G, source/drain electrodes 155 and 157 are formed on the semiconductor pattern 153 and a data line 120 is formed along one edge of the pixel region. A lower data pad electrode 191a is also formed at one end of the data line 120. As an example, the source/drain electrodes 155 and 157, the data line 120 and the lower data pad electrode 191a are prepared by forming a metal layer on the gate insulation layer including the semiconductor pattern 153 and the pixel electrode 160 and by patterning the metal layer through a photolithography process using a fifth mask. The metal layer can be formed of at least one metal selected from a conductive metal group which includes aluminum Al, an aluminum alloy AlNd, tungsten W, chrome Cr, molybdenum Mo, aluminum/chrome Al/Cr, aluminum/molybdenum Al/Mo, and others.

Figure 14H:
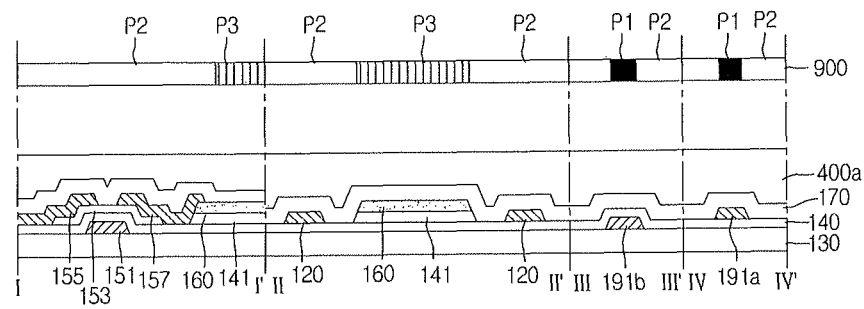
Figure 14I:
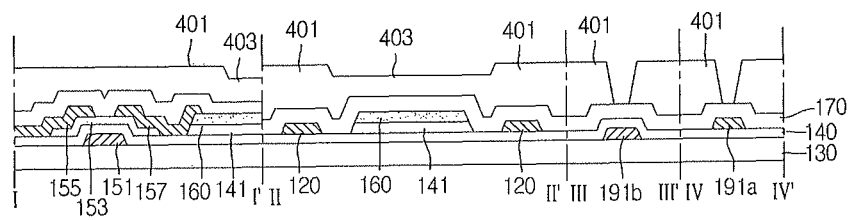

A passivation layer 170 of a constant thickness is formed on the gate insulation layer 140 including the semiconductor pattern 153, the source/drain electrodes 155 and 157, the data line 120, the lower data pad electrode 191a and the pixel electrode 160, as shown in FIG. 14H. Also, first and second photo resist patterns 401 and 403 shown in FIG. 14I are formed on the passivation layer 170. The first and second photo resist patterns 401 and 403 are prepared by forming a photo resist layer 400a on the passivation layer 170 and exposing and developing the photo resist layer 400a using a sixth mask 900.

The sixth mask 900 can become a half tone mask or a diffraction mask. Such a mask 900 includes an interception region P1 intercepting light (or ultraviolet rays), a semi-transmission region P3 allowing a part of light to be penetrated through, and a transmission region P2 enabling light to be fully penetrated through.

The exposing and developing process using the-above mentioned mask 900 forces the photo resist layer 400a to be partially and completely removed in the thickness direction according to a region. In accordance therewith, the first and second photo resist patterns 401 and 403 with different thicknesses from each other are formed.

Figure 14J:
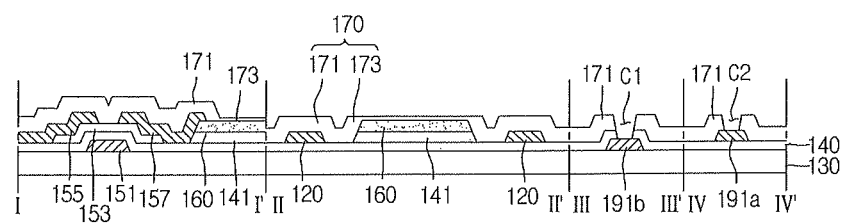

The lower gate and data pad electrodes 191b and 191a are partially exposed to the exterior by first and second contact holes C1 and C2, as shown in FIG. 14J. The first and second contact holes C1 and C2 are formed through an etching process of removing the passivation layer 170 opposite to the regions from which the photo resist layer 400a is completely removed in the thickness direction. More specifically, the lower gate pad electrode 191b is externally exposed by the first contact hole C1, and the lower data pad electrode 191a is externally exposed by the second contact hole C2.

Also, the passivation layer 170 is patterned using the first photo resist pattern 401 on a region corresponding to the pixel electrode 160 and the second photo resist pattern 403 on the other region not corresponding to the pixel electrode 160. As such, the passivation layer 170 is divided to have first and second portion 171 and 173 with different thicknesses from each other. In other words, the second portion 173 within the pixel region corresponding to the pixel electrode 160 has a thinner thickness than that of the first portion 171 on the other region not corresponding to the pixel electrode 160.

Figure 14K:
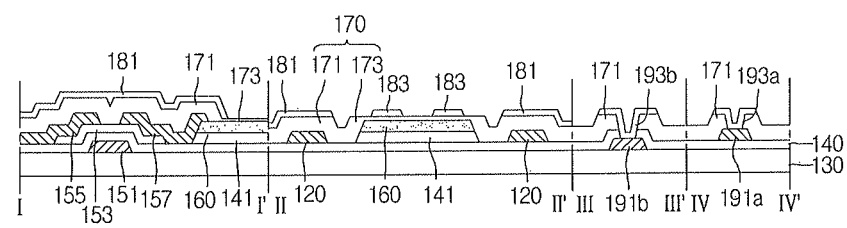

As shown in FIG. 14K, a common electrode wiring 181 is formed on the first portion 171, and a common electrode pattern 183 is formed on the region corresponding to the pixel electrode 160 (i.e., on the second portion 173). As an example, the common electrode wiring 181 and the common electrode pattern 183 are prepared by forming a transparent metal layer on the first and second portions 171 and 173 of the passivation layer 170 and patterning the transparent metal layer through a photolithography process using a seventh mask. Also, an upper gate pad electrode 193b is formed on the lower gate pad electrode 191b, and an upper data pad electrode 193a is formed in the lower data pad electrode 191a. The transparent metal layer can include one selected from a group including transparent metal materials, such as ITO (Indium Tin Oxide), ZnO (Zinc Oxide) and IZO (Indium Zinc Oxide), and an alloy containing at least two thereof.

In this way, the manufacturing method of the thin film transistor substrate according to a fourth embodiment of the present embodiment allows a part of the passivation layer 170 opposite to the pixel electrode 160 to be etched by a constant thickness, when the contact holes for the gate and data pads is formed through the photolithography process using the half tone mask or the diffraction mask, thereby forming the first and second portions 171 and 173. As such, the distance between the pixel electrode 160 and the common electrode pattern 183 is reduced and the distances of the gate and data lines 110 and 120 with respect to the common electrode wiring 181 is constantly maintained. As a result, the LCD device can reduce not only the parasitic capacitance but also the power consumption by enlarging the storage capacitance.

Moreover, the manufacturing method of the thin film transistor substrate according to the fourth embodiment of the present disclosure allows a step-height compensation pattern 141 to be formed between the pixel electrode 160 and the gate insulation layer 140 and to compensate for the stepped structure which is generated along the edges of the pixel region by the first and second portions 171 and 173 of the passivation layer 170. Accordingly, the thin film transistor substrate can prevent light leakage and furthermore enhance image quality.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

The invention claimed is:
1. A liquid crystal display device, comprising:
a substrate;
pixel regions defined by a plurality of gate lines and a plurality of data lines arranged on the substrate which are arranged to intersect with each other on the substrate;
thin film transistors each at intersections of the pluralities of gate and data lines;
pixel electrodes in each of the pixel regions;
a passivation layer on an entire surface of the substrate provided with the thin film transistors, the gate lines, the data lines and the pixel electrodes; and common electrode wirings and common electrode patterns on the passivation layer, wherein the passivation layer includes a first portion formed on an gate insulation layer opposite to the thin film transistors, gate lines and data lines, and second portions formed on the pixel regions corresponding to the pixel electrodes in a thinner thickness than that of the first portion.

2. The liquid crystal display device according to claim 1, wherein the first portion and the second portions are formed in the same layer.

3. The liquid crystal display device according to claim 1, wherein the second portions are formed by etching a part of the first portion through a photolithography process which uses one of a half tone mask and a diffraction mask.

4. The liquid crystal display device according to claim 1, wherein the common electrode wiring is formed on the first portion.

5. The liquid crystal display device according to claim 1, wherein the common electrode patterns are formed on the second portions, respectively.

6. The liquid crystal display device according to claim 1, wherein the first portion is formed in a stacked layer structure and the second portions is formed in a single layer structure.

7. The liquid crystal display device according to claim 6, wherein the first portion includes first and second passivation layers.

8. The liquid crystal display device according to claim 6, wherein the second portions include any one of first and second passivation layers.

9. The liquid crystal display device according to claim 1, wherein the first and second portions cause a stepped structure to be generated along a boundary there between.

10. The liquid crystal display device according to claim 1, further comprises step height compensation patterns formed between the gate insulation layer and the second portions and configured to compensate for a step height.

11. A method for manufacturing an LCD device, comprising:

forming gate electrodes, gate lines and gate pads on a base substrate;

forming a gate insulation layer on the base substrate with the gate electrodes, the gate lines and the gate pads;

forming semiconductor patterns on the gate insulation layer;

forming a pixel electrodes on the gate insulation layer corresponding to pixel regions;

forming source/drain electrodes and data lines on the gate insulation layer provided with the semiconductor patterns; and forming a passivation layer on the gate insulation layer provided with the semiconductor patterns, the source/drain electrodes, the pixel electrodes, gate lines and the data lines, wherein the passivation layer is defined into: a first portion opposite to the semiconductor patterns, the source/drain electrodes, the gate lines and the data lines; and second portions, respectively opposite to the pixel electrodes, which are formed in a thinner thickness than that of the first portion through a photolithography process using any one of a half tone mask and a diffraction mask.

12. The method according to claim 11, wherein the first portion and the second portions are formed in the same layer.

13. The method according to claim 11, wherein the second portions are formed by etching a part of the first portion through a photolithography process which uses one of a half tone mask and a diffraction mask.

14. The method according to claim 11, further comprises forming a common electrode wiring on the first portion.

15. The method according to claim 11, further comprises forming common electrode patterns on the second portions.

16. The method according to claim 11, wherein the first portion is formed in a stacked layer structure and the second portions are formed in a single layer structure.

17. The method according to claim 16, wherein the first portion includes first and second passivation layers.

18. The method according to claim 16, wherein the second portions include any one of first and second passivation layers.

19. The method according to claim 11, wherein the first and second portions cause a stepped structure to be generated along a boundary there between.

20. The method according to claim 11, further comprises forming step height compensation patterns, which is used in compensating for a step height, between the gate insulation layer and the second portions.

* * * * *